United States Patent [19]

Fishbaine et al.

[11] Patent Number: 5,331,406
[45] Date of Patent: Jul. 19, 1994

[54] MULTI-BEAM LASER SENSOR FOR SEMICONDUCTOR LEAD MEASUREMENTS

[75] Inventors: David Fishbaine; John P. Konicek, both of Minneapolis; Steven K. Case, St. Louis Park; Timothy A. Skunes, Columbia Heights; Jeffrey A. Jalkio, St. Paul, all of Minn.

[73] Assignee: CyberOptics Corporation, Minneapolis, Minn.

[21] Appl. No.: 989,519

[22] Filed: Dec. 11, 1992

Related U.S. Application Data

[63] Continuation-in-part of Ser. No. 719,727, Jun. 25, 1991.

[51] Int. Cl.$^5$ .............................................. G01N 21/88
[52] U.S. Cl. .................................... 356/375; 356/237
[58] Field of Search ............... 356/375, 237; 250/571, 250/572, 562

[56] References Cited

U.S. PATENT DOCUMENTS

| | | |
|---|---|---|
| 3,636,635 | 1/1972 | Lemelson . |
| 3,854,052 | 12/1974 | Asar et al. . |
| 4,615,093 | 10/1986 | Tews et al. . |
| 4,812,666 | 3/1989 | Wistrand . |
| 5,114,229 | 5/1992 | Hideshima . |
| 5,162,866 | 11/1992 | Tomiya et al. . |

FOREIGN PATENT DOCUMENTS

| | | |
|---|---|---|
| 2303751 | 12/1990 | Japan . |
| 2183820 | 6/1989 | United Kingdom . |

Primary Examiner—Richard A. Rosenberger
Attorney, Agent, or Firm—Dorsey & Whitney

[57] ABSTRACT

A high speed, high precision laser-based semiconductor lead measurement system for use on surface mount component placement machines. A multi-beam laser system is used to accurately sense the position and condition of each of the many leads used on integrated circuits prior to their placement on a surface mount circuit board by a pick and place machine. Using two, three or four laser beams, the non-contact sensor system can, with the highest degree of resolution, determine lateral orientation, height, colinearity, and coplanarity of leads for integrated circuit components, even those having an ultra-fine pitch. Determination of the lead position by the invention is based on the integrated circuit leads occluding the light of one or more precisely directed and focused laser light sources. Each integrated circuit lead is passed nominally through the focal point of a laser beam. The position of each lead is determined when it blocks all or a portion of the light of the laser beam. A processor means is used to calculate the actual position of each lead. The difference between the actual position of the lead and the nominal position of the lead can then be computed. The position of each lead is then sorted to determine the greatest deviation of any lead from a best fit line or from the Seating Plane. The processor may then either generate a reject or a repositioning signal to the component placement machine for proper placement of the integrated circuit upon the surface mount circuit board.

50 Claims, 11 Drawing Sheets

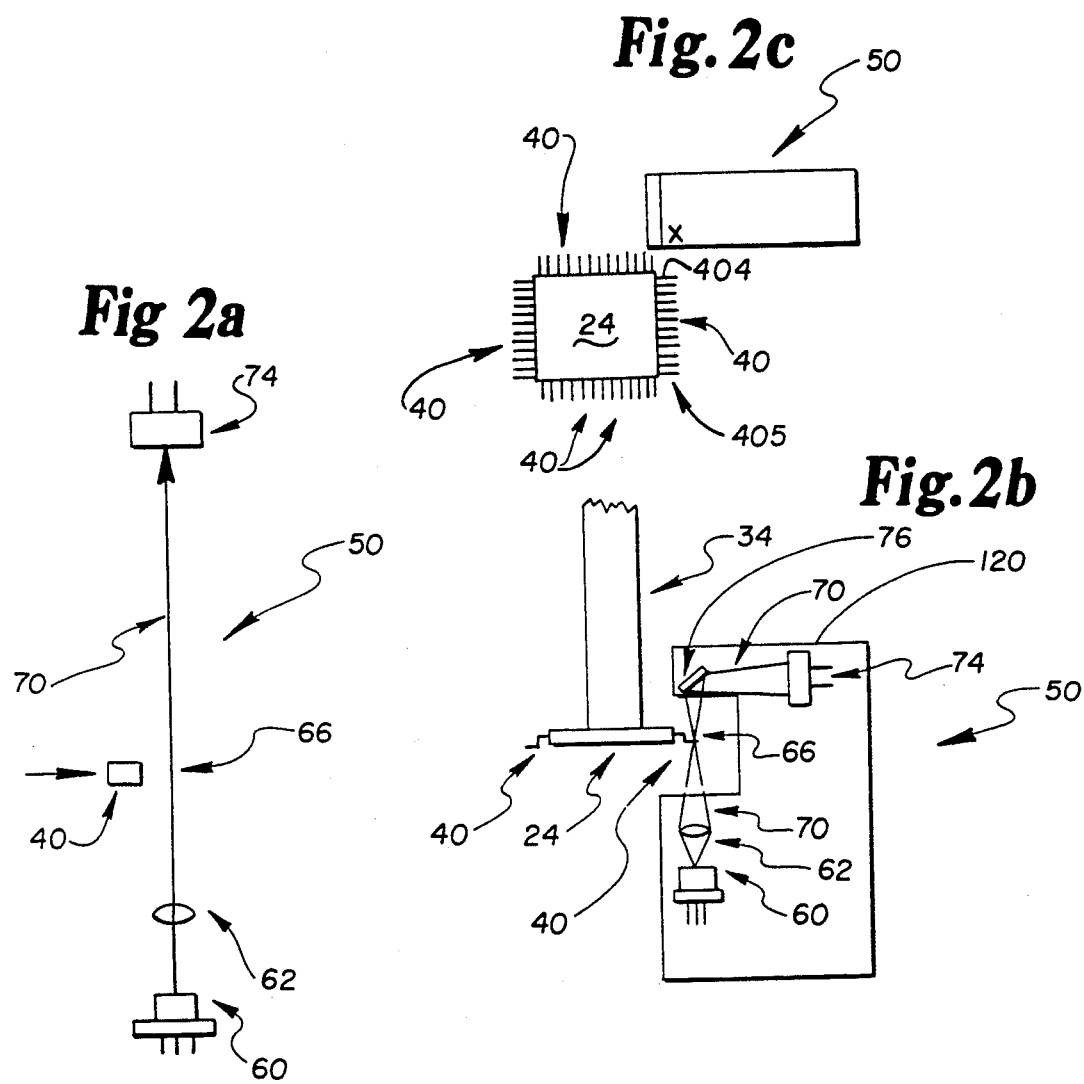

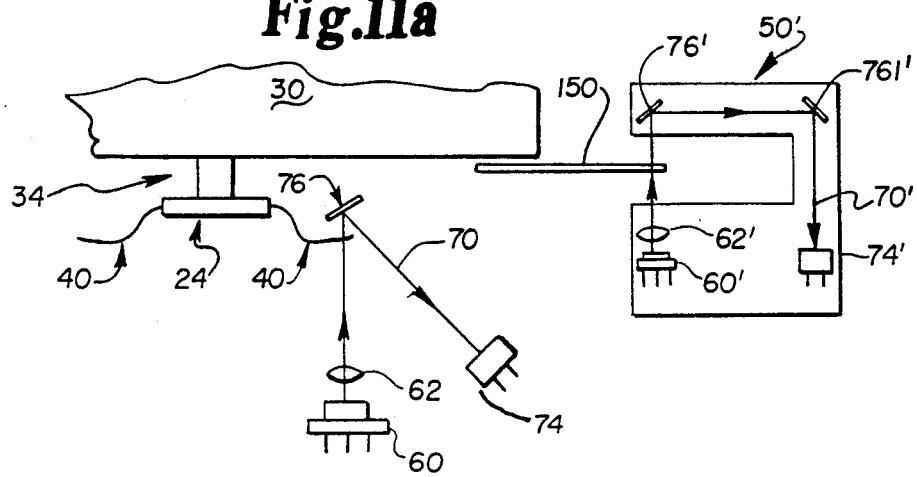
Fig.11a
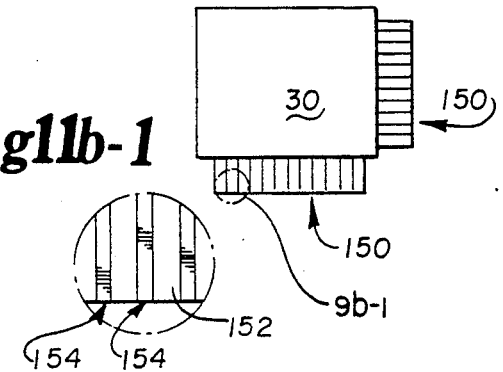
Fig.11b
Fig11b-1
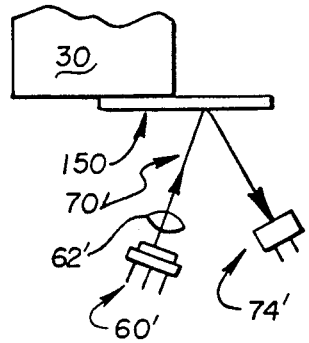
Fig.11c

MULTI-BEAM LASER SENSOR FOR SEMICONDUCTOR LEAD MEASUREMENTS

RELATED APPLICATIONS

This is a continuation-in-part of application Ser. No. 07/719,727, filed Jun. 25, 1991, entitled "LASER BASED SEMICONDUCTOR LEAD MEASUREMENT SYSTEM."

BACKGROUND OF THE INVENTION

The invention relates to vision systems for accurately sensing the position and condition of leads used on integrated circuits prior to placement of the integrated circuit on a circuit board by a surface mount pick and place machine. More particularly, the invention relates to a non-contact laser-based sensor system which can, with the highest degree of resolution, determine lateral orientation and coplanarity of leads for all such integrated circuit components, even those having an ultra-fine pitch.

As electronic devices get smaller and smaller, and yet more complex, electronic components which are connected together to achieve the electronic functions of such devices are also decreasing in size. Additionally, many functions are being incorporated in single unitary monolithic integrated circuits. These integrated circuit components, which are also called semiconductor packages or chips, have a number of leads or elements providing electrical connections. As a consequence of their small size, integrated circuits are created in a configuration referred to as quad flat packs (QFPs) or quad packs with closely spaced leads emanating from each side of the quad pack. QFPs are particularly configured for surface mount placement with special leads which are referred to as gull wings. The QFPs are precisely placed by a pick and place machine upon the surface of a circuit board with the gull wing leads making proper contact with the circuit connections or pads which are subscribed on the circuit board or work piece. Similarly, more and more manufacturers are creating integrated circuits with even more delicate leads structured on tape, which is used in a process called tape automated bonding (TAB).

The separation between the centers of any pair of adjacent leads on such components is referred to as the pitch. Currently, a commonly manufactured component separation is 25 mil pitch, the center of each lead spaced at 25 thousandths of an inch intervals. However, advances in component manufacturing technology have produced integrated circuits having 15 and 10 mil pitches and TAB components have been created having several hundred leads spaced with a 4 mil pitch.

For automated manufacturing of electronic devices using these microelectronic components, the highest degree of accuracy in positioning and placing such components is required. To perform this delicate task, precision surface mount component placement machines have been developed.

There are two types of component placement machines in common use today. One of which is a cartesian system where one or more vacuum quills are used to travel to a bin, pick up a component, properly orient the component and carry it to a circuit board or other work piece to precisely place the component in its proper location. The proper location is the one where the leads make proper contact with the circuit connections which are subscribed on the circuit board or work piece. Another type of placement system in use is a carousel or turret placement system where components are picked up from the bin and stepped through stations located around the perimeter of a circular component carrying mechanism for placement on the circuit board. The components are not aligned in the component bins. Typically, gull wing type components may be out of position by plus or minus 50 mils and plus or minus 5 degrees angular orientation. Therefore, the orientation of components from bins must be determined prior to placement. The present invention is useful with both types of systems which must accurately place components with the highest degree of speed and accuracy.

Surface mount circuit boards have a number of small individual pads. Each lead from each electrical component must be placed precisely on one circuit board pad, to ensure proper electrical contact, thus requiring correct angular orientation and lateral positioning of the component. The dimensions of components to be placed normally vary between 0.02 inch and 2.0 inches.

In a surface mount component placement machine, a transport arm picks up the component from a component bin utilizing a vacuum quill as the primary instrument which gently picks up the component to be placed and transports it between the component bins and the circuit board. The transport arm moves the component from the bin to the circuit board located on a work table. Most component placement machines have a built in position encoder which electromechanically determines the position of the placement head. The vacuum quill is attached to the placement head and is moved from the component bin to the circuit board by the placement head. Therefore, the component placement machine knows the position of the quill based upon the encoder reading. The encoders generally provide readings within plus or minus 4 microns. The accuracy of the encoders is a limitation of the component placement machine's ability to accurately place components on a circuit board. During transport, the angular orientation of the component and the offset of the component from the center of the quill are determined. The condition of the leads is also checked to determine whether any are bent or skewed. Any necessary corrections in placement are then calculated and the placement head is adjusted to accommodate the corrections. The vacuum quill is then precisely lowered to fit the component on the circuit board. In current component placement machines, the transport arm and quill move at approximately one meter per second. However, the speed of movement may range from zero to 8 meters per second. At this speed, it is difficult for current systems to handle the fine pitch and range of components that must be placed and to achieve the accuracy required for alignment.

For quality manufacturing, component leads must be placed with at least 80% overlap of lead onto the corresponding pad of the circuit board. A device having a 20 mil pitch generally has 10 mil wide leads. With an 80% overlap, at least 8 mils of the lead width must be on the pad with no more than 2 mils of the lead width off the pad. In general, sensing systems used to align parts for placement must have five to ten times better resolution than the accuracy required. Therefore, 0.2 to 0.4 mil image resolution is required to achieve the maximum placement error of 2 mils specified for quality manufacturing methods.

The leads on integrated circuits are manufactured in a variety of ways, such as stamping and etching. The shape of the leads created from different manufacturing methods varies. One method of forming leads is to apply photoresist to the surface of the metal and expose it to light. When exposed to light, the photoresist chemically etches through the metal to create the leads. The etch rate may be such that the lead is not formed with substantially vertical walls. Rather, the walls take on a scalloped shape, with the lead cross section assuming a substantially trapezoidal shape. For instance, if leads are etched from the top down, their sides are jagged and their lower or base surface is larger than the upper surface. These irregularities in lead shape require lead sensing equipment to be specially configured in order to handle the different shapes.

Quad flat packs (QFPs) can be manufactured with bumpers that extend outward beyond each corner of the component and beyond the leads of the component. The bumpers assist in protecting leads from being bent out of position. Bumpered QFPs present new problems for lead sensing equipment. The bumpers, in providing physical protection to keep the leads from being bent, block conventional vision sensing systems. The bumpers may extend as far as 8 microns beyond the leads.

Conventional vision systems used in conjunction with component placement machines for lead determination use a solid state television camera having a resolution of 512×512 picture elements or pixels. A two inch part and a corresponding two inch field of view with 512 elements produces a basic resolution of 4 mils or 4 thousandths of an inch. This is not a sufficient resolution and, in fact, as pointed out above, it is necessary to achieve a resolution which is at least an order of magnitude greater. One solution that has been suggested is the use of multiple lenses. Using different lenses to achieve the requisite magnification provides multiple fields of view. However, changes in the lens system consumes time, slowing the placement process and, thus, trades speed for accuracy.

Another solution that has been proposed is the use of super-resolution. With backlighting, a shadow is cast on the solid state pixel elements of a detector array and, by applying gray scale image processing algorithms to the intensity information of shadow edges cast upon the detector array, a super-resolution can be achieved which is approximately four times the resolution that can be achieved with binary processing.

Yet another solution proposed is a two-dimensional detector array having as many as 2,000×2,000 elements. Such a product is manufactured by Eastman Kodak of Rochester, N.Y. However, this solution is prohibitively expensive.

Finally, the use of linear arrays having 1,000–2,000 detector elements is also possible. Using such a system, the motion of the part is synchronized with continuously read successive frames from the array to build up to a two-dimensional image. With super-resolution, an accuracy of resolution is achieved equivalent to that needed for a 20 mil pitch device.

What is needed is an economical system which can accurately locate leads having 15, 10, and even 4 mil pitch. These systems must have an accuracy of resolution in the range of at least 0.02 mils. What is needed is a system which can accurately locate leads of various shapes and sizes. What is needed is a sensing system where the light is not obscured from reaching the leads by bumpers which provide physical protection to keep the leads from being bent. The present invention is addressed to fulfill these needs.

SUMMARY OF THE INVENTION

The present invention is a multi-beam laser-based sensor system, which in its basic embodiment can detect the lateral position of leads on an integrated circuit (IC) array with a resolution of 0.02 mils. Preferred embodiments using multiple laser beams can also calculate the height, colinearity and coplanarity of the leads. This invention provides the ability to examine leads of an bumpered integrated circuit without the bumpers obscuring light necessary to detect, if necessary, all four corners of all of the leads.

The preferred embodiment incorporates four laser diodes projecting four separate beams of laser light coming to a focus at the same point in space. From that point, the laser beams diverge and fall on two detectors. To avoid interference between the lasers, the four lasers are sequentially activated with the result that only one diode is on at any given time. Even though only a single laser diode is activated at any given time, the multiplexing rate is rapid enough relative to the placement head's velocity to consider all four laser beams as being simultaneously present for most calculations.

The preferred embodiment calculates lead heights based upon the lateral distance traveled along the scan axis between the interruption of specific laser beams. The scan axis is the path of relative motion between the sensor system and component. The resolution of measurement of lateral positions along the scan axis directly affects the resolution of the calculated height. The resolution of a pick and place machine's encoder can be increased by an interpolation method or a phase locked loop rate multiplier.

The four lasers of the preferred embodiment are arranged in two pairs, each pair working together to detect a particular corner of a lead's cross section. Due to the arrangement of the four lasers in pairs directed at particular corners of a passing lead, the system is able to detect and measure the position of each of the four corners on the cross section of each lead. In this manner, the system is able to accurately determine the lateral position, colinearity, and coplanarity of an integrated circuit's leads.

It is an object of the invention to analyze the leads on an integrated circuit component to determine if any of the leads are bent.

It is an object of the invention to sense the lateral lead position of each lead on an integrated circuit and to determine whether any lead position deviates from its nominal position.

It is an object of the invention to determine the colinearity of leads on an integrated circuit component.

It is an object of the invention to check the coplanarity of leads on an integrated circuit component.

It is an object of the invention to detect the positions and heights of the bottom corners of the leads on an integrated circuit component to determine their lateral position, colinearity and coplanarity.

It is an object of the invention to detect the positions and heights of the bottom corners of the leads on an integrated circuit component with bumpers to determine their lateral position, colinearity and coplanarity.

It is an object of the invention to check the lateral position, colinearity and coplanarity of leads on an integrated circuit component with a degree of accuracy in the 0.01 mil range for lateral position and in the 0.06 mil range for colinearity and coplanarity.

It is an object of the invention to check the lateral position, colinearity and coplanarity of leads on an integrated circuit component with bumpers with a degree of accuracy in the 0.01 mil range for lateral position and in the 0.06 mil range for colinearity and coplanarity.

These and other objects and advantages of the invention will become obvious to those skilled in the art upon review of the following description, the attached drawings and the appended claims.

DESCRIPTION OF THE DRAWINGS

FIG. 2, comprising FIGS. 2a-2c, shows a preferred embodiment of the invention. FIG. 2a is a representation of basic elements of the invention. FIGS. 2b and 2c represent a side view and top view of the mechanical structure of one embodiment of the invention.

FIGS. 7a and 7b show leading edge detection and FIG. 7c and 7d show trailing edge detection.

FIG. 10 is a schematic of the basic electronics for a four beam system.

FIG. 11, consisting of FIGS. 11a-11c, illustrates use of the invention to dynamically determine the position of the placement head on the component placement machine. With this embodiment of the invention, the precise location of both the optical target of the placement head and the component leads are simultaneously determined. The focused laser beam can pass through the optical target as illustrated in FIG. 11a or can be reflected from the optical target as illustrated in FIG. 11c.

DESCRIPTION OF PREFERRED EMBODIMENTS

It is an object of current manufacturers of electronic products, such as audio and video devices and computer systems, to package such products in as small a package or area as is possible using current technology. To achieve this objective, and to economically manufacture such electronic devices, it has also been necessary to automate the manufacturing process. As a consequence, surface mount electronics have been developed. Surface mounted electronic components 24 are placed on circuit boards 28 specially designed to receive them using pick and place machines. It is imperative with such automated manufacturing for quality control and, in order to create an operable device, that each component 24 be precisely placed in its proper position on the circuit board 28.

Figure 1:
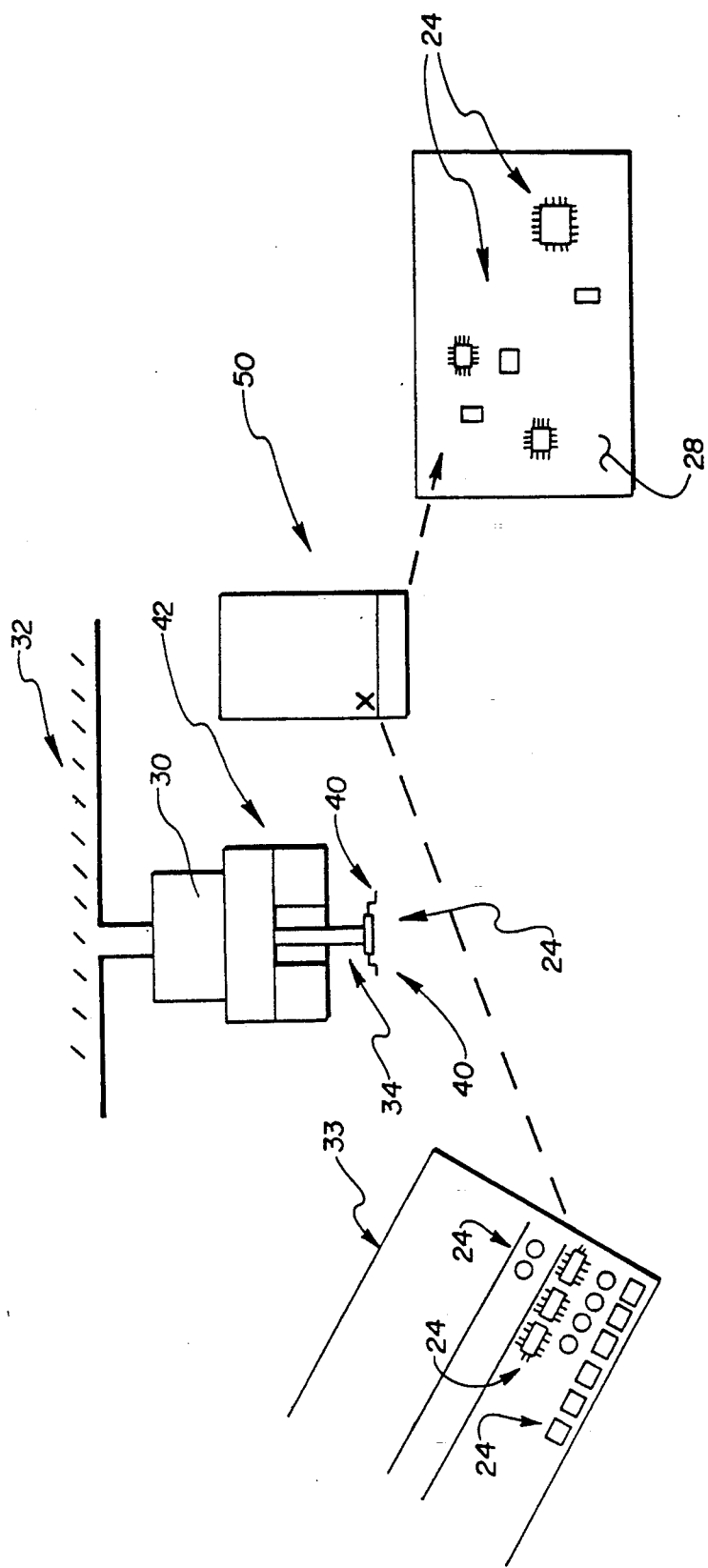
FIG. 1 represents a component placement system utilizing the present invention. Components are picked up from a source tray by the placement head and associated vacuum quill. The component is preferably positioned in the correct angular orientation on the vacuum quill and then passed through one or more sensors constructed in accordance with the present invention. Thereafter, the component is precisely placed by the component placement machine on a circuit board adapted to receive the component.

FIG. 1 shows a typical component placement machine system where a placement head 30 is suspended and driven from a rail 32, picks up an electronic component 24 to be placed with a vacuum quill 34 and, with as much speed as possible, transports the component 24 to the circuit board 28 and precisely places the electronic component 24 in the proper location with its leads 40 precisely placed on the corresponding circuit pads or lines on the circuit board 28. Co-pending U.S. patent application Ser. No. 07/659,983, filed Feb. 22, 1991, entitled A High Precision Component Alignment Sensor System, discloses a non-contact laser-based alignment sensor 42 which is carried on the placement head 30 and is utilized to generate the correct angular orientation in the X-Y plane of the component 24 for placement and also determines electronically any offset of the center of the component 24 with the center of the vacuum quill 34 which carries the component 24 to the circuit board 28. The disclosure is incorporated herein by reference.

This high speed laser-based system 42 of the prior invention utilizes a stripe of laser light (not shown) which passes by and is blocked by the component 24 whose alignment is being sensed. The shadow cast by the component 24 is detected by a linear array detector (not shown) whose data is analyzed to detect the leading edge and the trailing edge of the shadow. This shadow edge detection information is analyzed to achieve an angular orientation of the component 24 and lateral alignment. Although angular orientation can be achieved with an accuracy of better than 0.03 degrees and lateral positioning can be achieved to an accuracy of better than 0.001 inches, the system is not designed to precisely locate each of the leads 40 of the component 24.

The prior sensor system 42 is suitable for leadless components 24 and all other components 24, including the components 24 which are sensed and placed with the use of the present invention 50. That sensor system 42 and the sensor system 50 of the present invention are suitable for handling all electronic component 24 sizes with which a surface mount component pick and place machine is conventionally used. Normally these electronic components 24 range in size between 0.02 inch and 2.0 inches, although even larger sizes can be accommodated.

It is normally the largest components 24 that are most difficult to accurately place. The larger components 24 tend to be integrated circuits with many delicate leads 40. These are the most expensive components 24, costing on the average of $100–$500. In addition, to assure compactness, for monolithic integrated circuits 24, lead 40 size and lead 40 spacing have been constantly shrinking. Current components 24 having a 25 mil pitch, or a spacing between leads of 0.025 inch, are common on quad flat pack components. However, components 24 with spacing of between 0.004 to 0.020 inches (4–20 mils) are beginning to appear on the market. These components 24 have hundreds of leads 40, each of which must be accurately placed upon and bonded to a corresponding pad or circuit line on the circuit board 28. For the smallest components 24, the spacing required is approximately the same as the diameter of a human hair. The accuracy of resolution to achieve such placement must be an order of magnitude greater than the maximum error permitted in placing such components 24.

A number of embodiments 50 are disclosed and claimed herein which provide solutions to problems which occur or potentially occur in the precise placement of the leads 40 of an integrated circuit 24, or other semiconductor devices 24, on a corresponding circuit board 28 with a pick and place machine. Each of the embodiments 50 is specifically designed to accurately locate the leads 40 on a semiconductor device 24 and to provide signals to the placement machine to most accurately place the component 24 if it can be placed within the design rules for the component 24, or to reject the component 24 if the sensor 50 determines that a possible short circuit or open circuit might occur because one or more leads 40 are bent in the vertical or horizontal plane of the leads 40.

The primary purpose in locating the leads 40 and determining colinearity and coplanarity is to determine where the bottoms of the leads 40 will lie on the circuit board 28. Colinearity is a maeaurement of how well the computed heights of the leads 40 on one side of an integrated circuit component 24 fit a line. In the preferred embodiment, the line used is the best fit line. In this case, the best fit line is a line wherein the sum of the squares deviations of the heights of the leads 40 are minimized. The positive or negative deviation of a single lead 40 from the best fit line can be calculated. In most cases, the colinearity measurement test will reject integrated circuit components 24 that would also fail a coplanarity test.

In performing coplanarity measurements, there are two methods which may be employed: the "Seating Plane" and the "Best Fit Plane". The industry standard test for coplanarity uses the Seating Plane methodology established by the Joint Electron Device Engineering Counsel (JEDEC) in Washington, D.C. JEDEC has released a standard (JESD22-B108) entitled *Coplanarity Test for Surface-Mount Semiconductor Devices* dated November 1991 which defines the Seating Plane of a surface mount part. The JEDEC standard Seating Plane is defined as the plane established by the contact points of three or more leads 40 that support the device 24 when it is placed on top of a planar surface. The deviation from coplanarity is defined as the distance between the intended contact point of a lead 40 and the established Seating Plane. Any device with one or more leads 40 that exceeds a specified deviation from coplanarity shall constitute a failure. The Best Fit Plane, on the other hand, is the plane defined such that the sum of the squares of the differences in elevation of each lead 40 from that plane is minimized (least squares fit).

Referring again to FIG. 1, a station 50 is shown having one or more laser-based sensors constructed in accordance with the teaching of this invention. As depicted in FIG. 1, the leads 40 of the component can be passed through the laser beam(s) 70 which are part of the invention 50 to analyze the lateral position and/or coplanarity of each of the leads 40. It will be understood by those skilled in the art that the motion of the leads 40 through the focal point 66 of the laser beam(s) 70 is relational and that the component 24 can be brought to a standstill and stabilized at the sensor station 50 and the sensor 50 moved by the leads 40 on a translation table (not shown) or the like. It will also be understood that both the sensors 50 and component 24 may be in motion simultaneously during the measurement.

FIG. 2 shows in FIG. 2a a representation of the basic components of the laser sensor 50 and, in FIGS. 2b and 2c a side view and top view of one physical configuration of the invention 50. The configuration includes a single light source 60, a laser diode, which is focused through a focusing lens 62 so that the focal point 66 of the laser beam 70, which is approximately 1 mil in diameter, is focused on the plane of the leads 40 passing through the sensor system 50. When the laser beam 70 is not blocked by the lead 40 being sensed, the laser beam 70 strikes a single detector 74.

While a single laser beam 70 is illustrated in FIG. 2a, it should be understood to represent, in this and subsequent drawings, a focused laser beam 70 as illustrated in FIG. 2b, the beam 70 having approximately a one mil focal point 66 located at the nominal plane of the leads 40 being analyzed with a depth of focus of about 20 mils. Also, while the detector 74 is shown in FIG. 1a to be in a direct, uninterrupted line of sight of the laser source, in practice the laser beam is preferably folded with the use of mirrors 76, lenses or prisms (not shown) so as to provide minimum intrusion above the component 24 for reasons to be discussed below. Since a single light source 60 is used with a control circuit 90 (shown in FIG. 4) to keep the laser power constant, constant illumination is assured. With a single detector 74 being utilized, uniformity of response from the detector 74 is assured. There are no pixel-to-pixel variations as are common in other proposed solutions. While it also is possible to use a focused laser beam 70 as a distance sensor to detect the leads 40, such an embodiment is subject to lead surface microstructure problems, nicks and scratches in the lead surface. Using the embodiment shown, the laser beam 70 is used as a backlighting source to cast a detectable shadow on the detector 74 which eliminates the potential of surface microstructure problems. Finally, by using a laser beam 70 focused directly on the leads 40 themselves, maximum utilization of data is possible, since all data corresponds to lead structure and it is not necessary to consider or reject data relating to the environment surrounding the chip 24 or the plastic packaging of the device 24 as is common in currently utilized solid state TV systems.

Figure 3A:
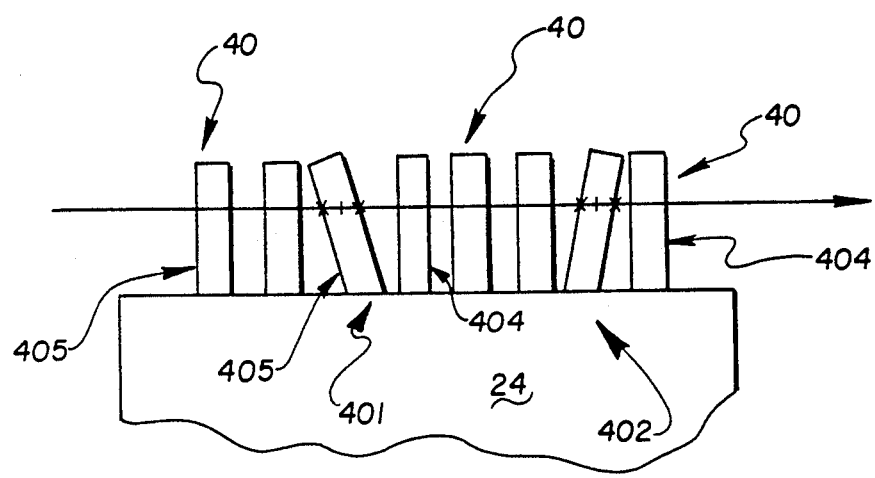
FIG. 3, consisting of FIGS. 3a-3b, shows, in FIG. 3a, a semiconductor package having bent leads in the lateral plane and, in FIG. 3b, an illustration of placement of leads which only partially overlap corresponding circuit connection pads.
Figure 3B:
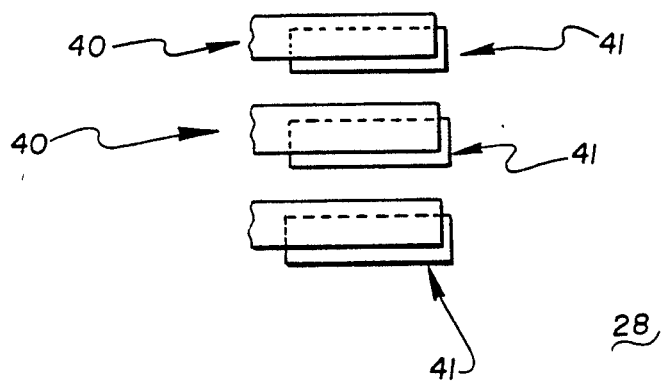

Multiple lead integrated circuit chips 24 are generally releasably but adhesively held on a strip of tape or the like, in the source tray 33. Therefore, generally, the leads 40 on the IC chip 24 have good coplanarity, that is, the lowest surface of the leads 40 are generally in the same plane. However, during packaging, shipping and loading into the source tray 33, it is possible for the leads 40 to get slightly bent or skewed so that all leads 40 are not always parallel for purposes of placement on the circuit board pads. FIG. 3a generally illustrates a component 24 having leads 40, two of which 401, 402 are bent, one 401 with a negative deviation, it trails its nominal position, and one 402 with a positive deviation. It is a general design rule of quality assurance that at least 80% of each lead 40 must be accurately placed on the circuit pad 41 which has been created to receive the lead 40. This placement is illustrated in FIG. 3b. As the shadow of the lead 40 is cast upon the detector 74, data is stored which accurately represents the leading edge 404 and trailing edge 405 of each lead 40 on the IC chip 24.

A processor means (94 shown in FIG. 4) is then used to average the detected position of the leading edge 404 and trailing edge 405 of each of the leads 40 to find the center of each of the leads 40. The difference between the measured center of the lead 40 and the nominal position for the lead 40 is then computed. The position of each of the leads 40 is then sorted by the deviation of that lead 40 from its nominal position.

Finally, the most negative deviation and the most positive deviation are averaged to get the recommended adjustment for purposes of placement of the leads 40 on the receiving pads 41 on the circuit board 28. If the adjustment cannot be made within the 80% design rule discussed above, a rejection signal can be generated and the part 24 is rejected for return to the manufacturer. In addition, one can adjust the orientation and orthogonal placement of the part 24.

Figure 4:
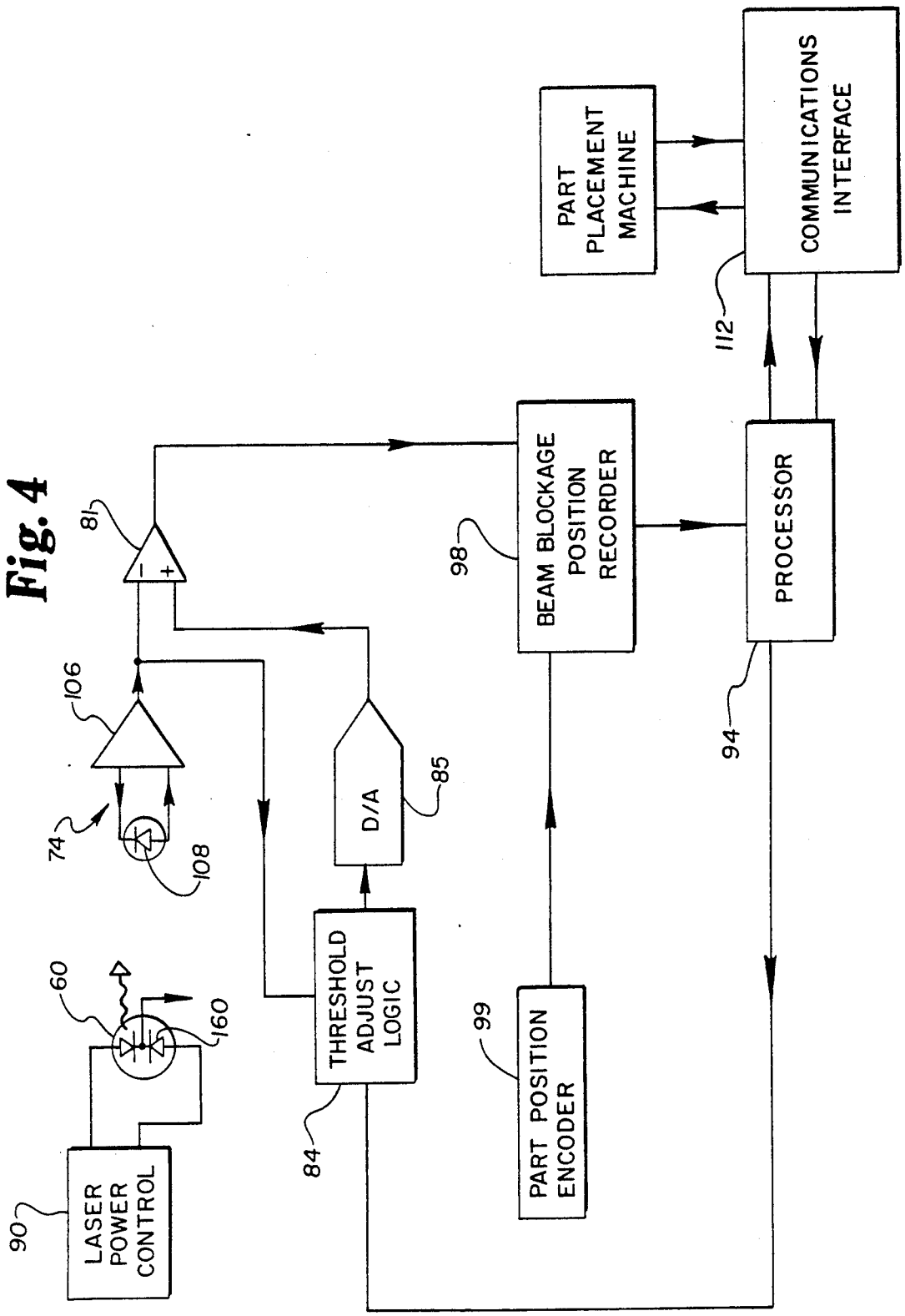
FIG. 4 is a schematic diagram of the sensor electronics.

The electronic circuitry utilized in this embodiment is illustrated in schematic form in FIG. 4. Determination of the lead positions 40 by the lead locator measurement and detection instrument 50 is based on the IC leads 40 occluding the light of the precisely directed and focused laser light source 60. Each IC lead 40 is passed through the focal point 66 of the directed and focused laser beam 70. The position of each lead 40 is determined when it blocks all or a portion of the light of the laser beam 70. The diameter of the laser beam 70 at the focal point 66 is typically 0.0001 inch, allowing for a highly accurate indication of when the lead 40 enters and exits the beam 70.

Blockage of the laser beam 70 is determined by monitoring the output of the light sensitive detector 74 and performing a comparison with a reference voltage. When each edge 404, 405 of each IC lead 40 is detected, the position of the vacuum quill 34 is recorded. Then, the processor 94 via the communications interface 112 provides outputs to the component placement machine for the purpose of determining the position that the leads 40 on the component 24 should be placed on the work piece 28.

The electronic circuitry of the lead locator instrument 50, includes the detector 74 and comparator 81. The detector 74 provides a voltage output level, corresponding to the amount of light impinging on the detector 74, to the comparator 81 via an amplifier 106. The output voltage of the detector 74 is accordingly inversely related to the amount of blockage of the laser beam 70. The comparator 81 compares the detector output voltage to a stepped reference voltage controlled by the threshold adjustment logic 84 and digital to analog converter 85, thereby providing a digital output measurement of beam blockage. The beam blockage signal from the comparator 81 has two states, beam blocked and beam not blocked.

The threshold adjust logic 84 drives a digital-to-analog (D/A) converter 85 to provide the stepped reference voltage to the comparator 81, and includes calibration logic for automatically adjusting the reference voltage applied to comparator 81 to compensate for occlusion of the laser beam 70 due to dust in the optical path of laser beam 70, as well as providing compensation for long term laser power drift. Outputs from the threshold adjust logic 84 are provided through D/A converter 85 for input to the comparator 81.

During the threshold adjust logic 84 sequence, the output voltage of the detector 74 when illuminated by the unblocked laser 70 is determined. Then a threshold voltage is calculated by taking a selected percentage of the unblocked detector 74 voltage output, for example fifty percent in the preferred embodiment. The threshold value so established is used to determine when a percentage of the laser beam 70 is occluded by a lead 40 during the lead locator 50 operation. Accordingly, "beam blockage" is determined by the comparator 81 when the amount of light detected by the detector 74 is a desired percentage of the amount of light 70 impinging on the detector 74 when the leads 40 are totally clear of the laser beam 70.

The decision logic of the electronic circuitry is based around the processor 94. Inputs to the processor 94 include the beam blockage position received from the beam blockage position recorder 98 relating to the instantaneous position of the quill 34 from the component placement machine encoder 99. Beam blockage position information is recorded each time the beam blockage signal changes state. Alternatively, dynamic signals 98 for more accurately locating the position of the component 24 and its leads 40 can be generated using the embodiment of the invention 50 described in connection with FIG. 11. If the component 24 is stationary and the laser is providing the relative motion, the position of the laser beam 70 must be recorded. The processor 94, through a communications interface 112 to the component placement machine, can be adapted to perform the computations described in connection with the various embodiments of the invention 50 in connection with FIGS. 2–12. The processor 94 can be programmed to compute lead position, lead height, lead width, coplanarity, rejection equations, repositioning equations, statistical information and a variety of other related information. Also preferably contained within the processor unit 94 is a component 24 library of the components 24 in the component tray and sufficient information, as described to compute the component 24 offset for purposes of placement of the component 24 on the circuit board 28. The output of the processor 94 is provided to the control module of the component placement machine through the communications interface 112 so that the component 24 can be precisely positioned. It will be obvious to one skilled in the art that numerous hardware and software possibilities exist for the processor 94 and communications interface 112 to the part placement machine.

The laser control circuit 90 employs a photo diode 160 packaged with a laser diode 60. The photo diode 160 monitors the optical intensity of the laser diode 60 to maintain a constant optical power output from the laser power control circuit 90.

The detector 74 includes a transimpedance amplifier 106 which generates a voltage proportional to the amount of light falling on the photo diode 108 of the detector 74. The comparator 81 receives the output of the amplifier 106 of the detector 74, and compares the detector output to the reference voltage supplied by the output of D/A converter 85. The D/A converter 85 receives its digital input from the threshold adjustment logic and applies the reference voltage to comparator 81.

The repeatability and accuracy of this invention are affected primarily by three factors: first, the ability to precisely control laser power output intensity, second, the detector's electronic signal to noise ratio, and third, the diameter of the focused laser beam 70. The invention's ability to precisely detect an edge or accurately detect when half a beam 70 is blocked is heavily influenced by changing these three factors. Thus, when necessary, the laser power control circuitry 90 can be improved to more precisely control and maintain a constant laser power output intensity. Also, the detector's electronic signal to noise ratio may be improved by refining the detector circuitry. Although, the diameter of the focused laser beam 70 may be decreased in size to enhance performance of the invention, this involves an engineering trade-off negatively effecting the length of the laser beam's depth of focus. As the diameter of the laser beam 70 is decreased the precision of the device increases however, the corresponding decrease in depth of focus negatively affects the repeatability of the sensor measurements. A small depth of focus may allow some leads 40 to pass outside the best focused area of the laser beam 70. The preferred beam diameter and depth of focus are approximately 1.3 mils and +/−25 mils respectively. Using the preferred diameter and depth of focus, the repeatability of measurements in the preferred embodiment is 0.02 mils. This performance can be improved by changing the three factors stated above.

One embodiment of the present invention was tested and determined to have a resolution accuracy of 0.7 microns. Since there are 25 microns per mil or thousandths of an inch, the invention demonstrates about 25 times higher resolution than available vision systems in use today.

Figure 5A:
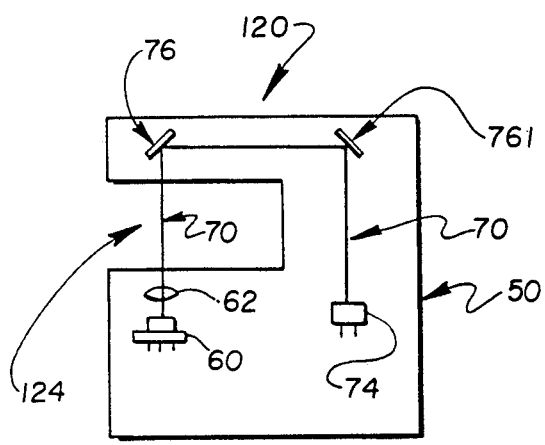
FIG. 5, consisting of FIGS. 5a-5c, illustrates alternative physical embodiments, each designed to minimize the physical intrusion of parts of the invention between the placement head of the component placement machine and the component whose leads are being analyzed.
Figure 5B:
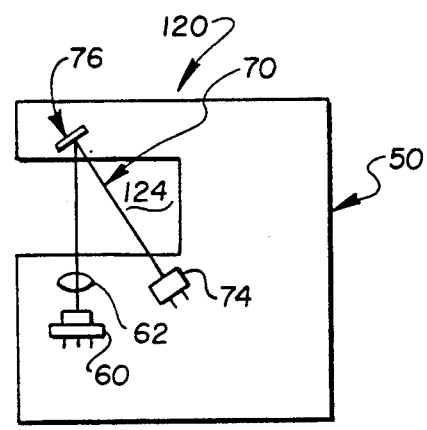
Figure 5C:
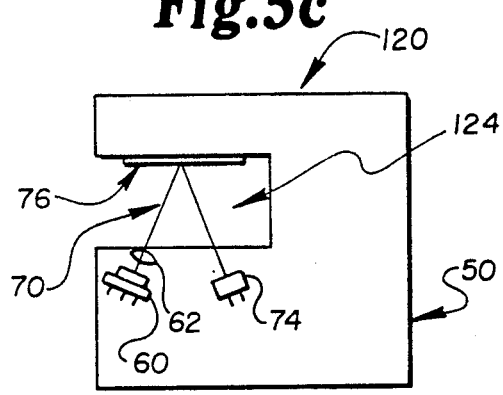

While the representation of the laser-based lead locator 50 in the lateral plane is represented in FIG. 2a with the detector 74 in a direct line of site of the lead 40, the focusing lens 62 and the laser diode 60, in actual practice, preferred embodiments are used which fold the laser beam 70 to accommodate the physical structure of the component placement machine. For accuracy of placement and to minimize vibration and deformation due to acceleration, it is desired to keep the length of the vacuum quill 34 on a component placement machine as short as possible. Therefore, it is necessary to keep the detecting arm 120 of the sensor 50 as thin or as narrow as possible so that it fits between the component 24 and the placement head 30 and so that it does not come in contact with or otherwise obstruct the placement head 30. As a consequence, a number of physical embodiments are illustrated in FIG. 2b and FIGS. 5a through 5c which permit an adequate focal length, but minimize the physical dimension of the sensing arm 120. As shown in FIG. 2b, a single reflecting mirror 76 is shown which folds the laser beam 70 onto the detector 74. As shown in FIG. 5a, two reflecting mirrors 76, 761 are utilized and the detector 74 can be located in the lower housing of the sensor 50. As shown in FIG. 5b, the sensor cavity 124 can be constructed with a depth so that the detector 74 can be accurately placed in an aperture bored into the sensor 50 housing to receive the occluded or passed laser beam 70. Finally, as shown in FIG. 5c, both the originating laser beam and the reflected laser beam can be located in suitably bored holes in the sensor housing with a flat horizontal mirror 76 interposed to reflect the laser beam 70. In a precisely constructed component placement machine, the mirror 76 of FIG. 5c can be adhered or otherwise fixed to the bottom surface of the placement head 30, or an alignment sensor 42, to provide a minimum intrusion into the space between the placement head 30 and the component 24.

A coplanarity measurement is important to assure that all the lowest surfaces of all the leads 40 are in the same horizontal plane to avoid an electronically defective circuit. A common method of manufacturing to connect the leads 40 to the circuit board 28 includes the use of a stencil on top of the circuit board 28. Solder paste is applied to the pads 41 on the circuit board 28 through the stencil. After the integrated circuits 24 are accurately placed on the solder paste, the circuit board 28 is baked in an oven. When baked, the solder melts and the component 24 is then electrically and mechanically attached to the board 28. Typically, solder paste is approximately 8 thousandths of an inch thick when applied. When it melts, it is approximately 4 mils or 4 thousandths of an inch thick. If one or more of the leads 40 are bent above or below the nominal plane of the other leads by more than 4 thousandths of an inch, they will not connect through the solder paste to the circuit board 28 and the result is an open circuit.

Figure 6:
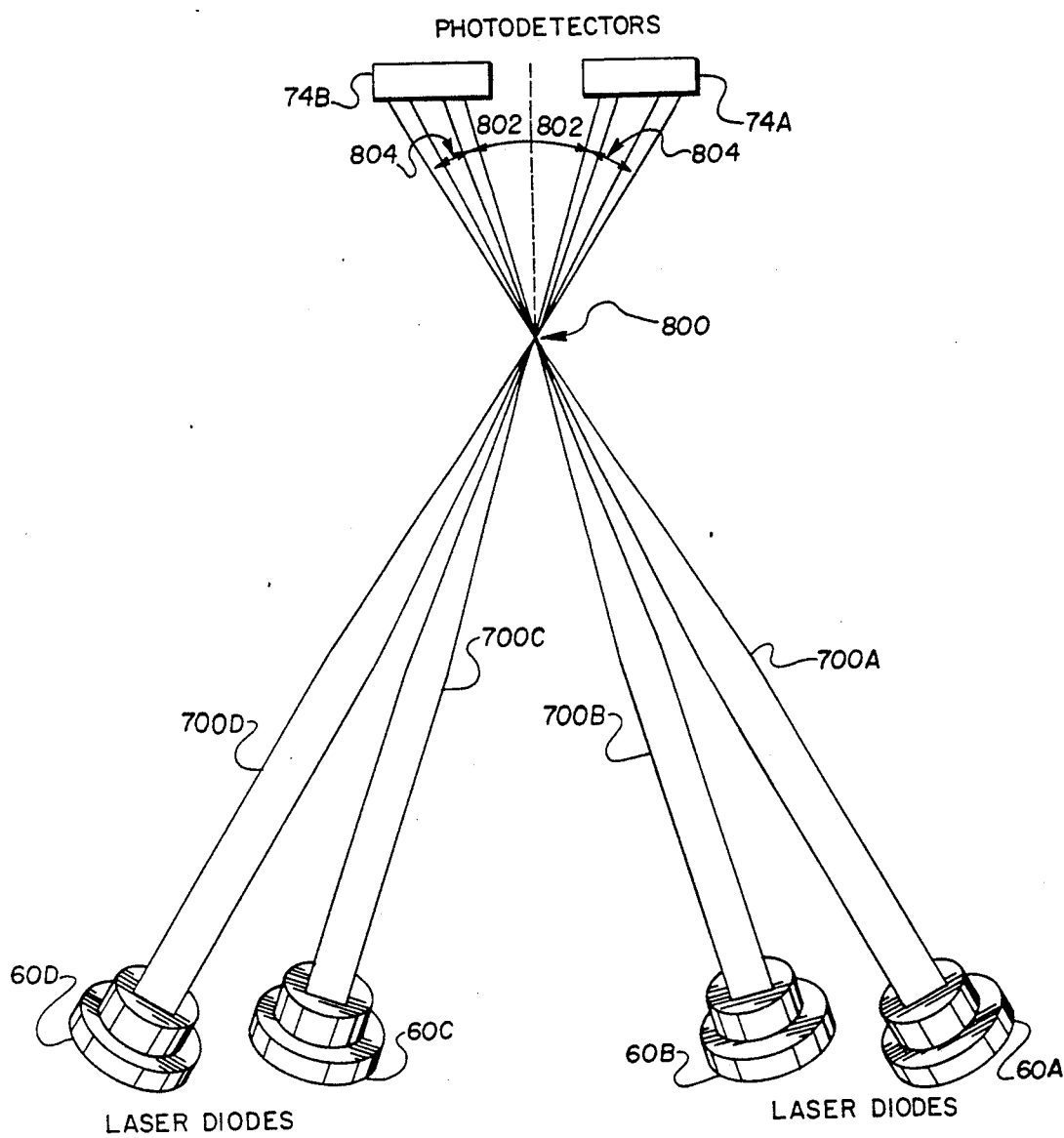
FIG. 6 illustrates a four beam configuration which can be used to analyze lateral position, colinearity and coplanarity with a high degree of resolution.

A preferred embodiment of the present invention, as shown in FIG. 6, can be utilized to check lateral displacement of any bent lead 40, colinearity of leads 40 on one side of a component chip 24, thickness of the lead 40, and the coplanarity of leads 40 on a given chip 24. FIG. 6 shows two pairs of laser diodes 60A–60D, both pairs of laser diodes 60A–60D being focused on a single point 800 and each pair having its own photodetector 74A–74B. Each pair of laser diodes creates a first beam 700A, 700C which is at an angle beta 802 from the normal and a second beam 700B, 700D which is at angle beta 802 plus alpha 804 from the normal. Since the beams are generally located in the same vertical plane, the closest beams from the two pairs form an angle of 2 beta 802. In this configuration, each pair of laser beams can detect one lower corner of a lead cross section and one upper corner of a lead cross section.

The preferred angular separation of the beams can be determined by taking two factors into account. Increasing the angular separation (alpha 804) provides more resolution and accuracy in the height measurement, but the angular separation must be small enough for the beams to pass unobstructed through the finest pitch parts including parts which have adjacent lead coplanarity errors of up to 0.005 inches. The preferred angle beta 802 is 20 degrees, but may range from 5 degrees to 40 degrees. The angle beta 802 plus alpha 804 is optimal at 35 degrees, but may range from approximately 25 degrees to 50 degrees. It is preferred for purposes of accuracy that the angle alpha 804 be as large as possible. However, the angle beta 802 is limited by the angle formed by the trapezoidal shaped leads' sides, with the bottom surface of the lead 40. The angle beta 802 plus alpha 804 is limited by the laser beam being blocked by an adjacent lead 40.

This embodiment calculates the lead heights from the measured difference in lateral position, along the scan axis, of the interruption of specific beam pairs. The resolution of measurement of these positions directly affects the resolution of the calculated height. The geometry implemented in the lead height calculation results in a resolution multiplier of about three. Therefore, if the encoder 99 (in the placement machine) has a resolution of five microns, for example, then the resulting height resolution will be about 15 $\mu$m. Since many QFPs will have a coplanarity tolerance of 100 $\mu$m or less, this 15 $\mu$m height resolution will often be too coarse. Interpolation is used to increase (make more fine) the resolution of measurement of the positions of beam interruption.

The embodiment calculates, from the measured lead elevations, the leads defining the Seating Plane and the elevations of all the leads 40 above the Seating Plane. Most consumers of this equipment prefer this method of calculation rather than the Best Fit Plane method. In summary, the Seating Plane is defined to be the plane upon which the part (being measured) would sit if it were placed gently onto a flat surface. A minimum of three leads 40 of the component 24 would be in contact with this plane and the center of gravity of the part would be enclosed with a triangle formed by three leads 40.

FIG. 6 shows one photodetector 74A, 74B for each pair of laser beams 700A-700B, 700C-700D. Although the preferred embodiment has one photodetector for each pair of beams, the system may be built with one photodetector for all four beams or four individual detectors, one for each beam. As the size of the photodetector is increased, its response time decreases, which has a negative effect on the sensor system 500. In order to restrict the surface area of the photodetector and maintain a reasonable response time, the single photodetector would have to be customized to the proper shape and size. This would increase the cost of the system relative to the two detector system. Four separate photodetectors, one for each beam, would also increase the cost of the system.

When the sensor 50 is in operation, it is important to be able to detect which laser beam is being occluded by the shadow of a lead 40 and avoid interference from an adjacent beam. There are several methods in which this may be accomplished, including use of different wavelengths of light. Although the four beams 700A-700D are simultaneously present in FIG. 6, the preferred embodiment is to multiplex the beams so that only one beam is present at any one point in time. Sequentially multiplexing the beams 700A-700D has been found to be the most economical solution.

Figure 7A:
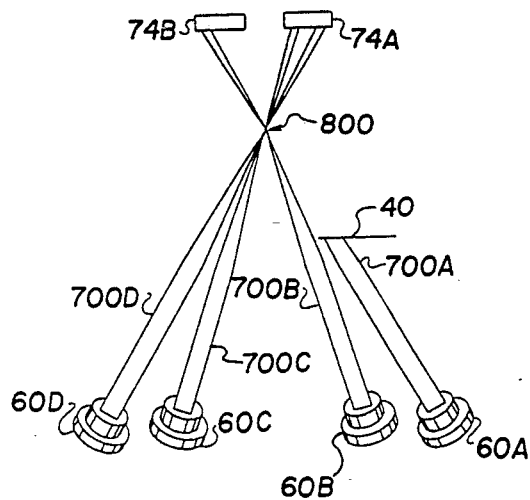
FIGS. 7a, 7b, 7c and 7d illustrate a four beam system analyzing a lead which is below the horizontal reference plane.
Figure 7B:
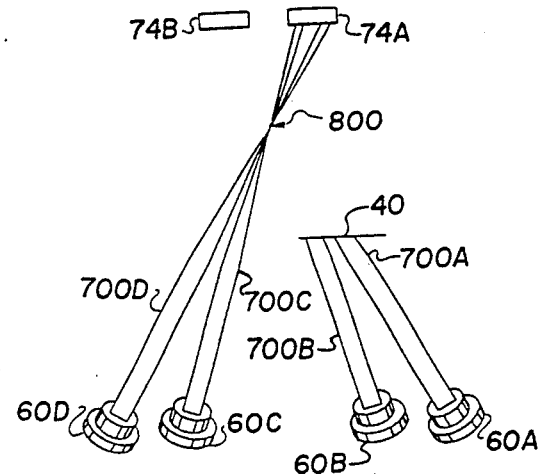
Figure 7C:
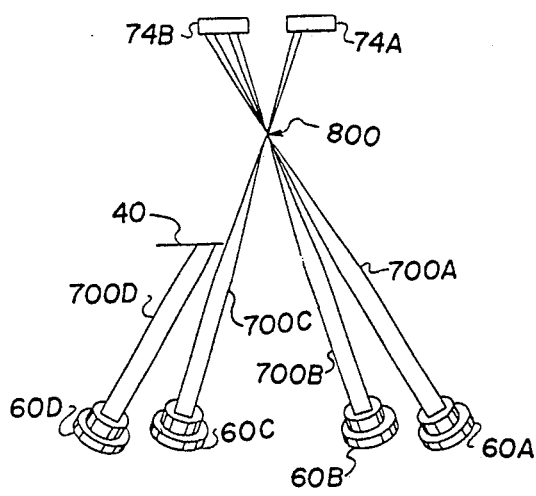
Figure 7D:
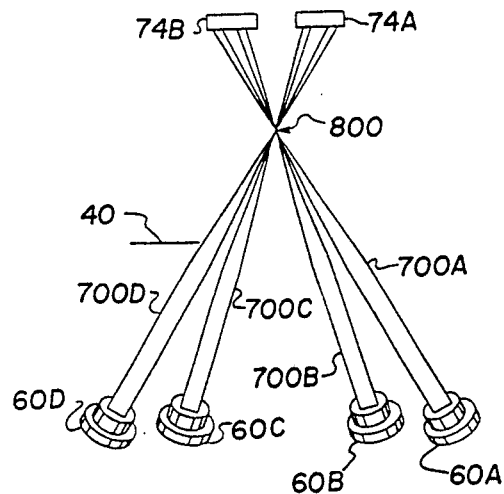

FIGS. 7a through 7d show the path of a lead 40 through the four beams 700A-700D of the sensor. FIG. 7a shows the leading edge 404 of an element occluding beam 4. FIGS. 7a and 7b depict operation of the leading edge detection system. FIGS. 7c and 7d depict the trailing edge detection system. The leading edge laser light sources 60A, 60B project two laser beams 700A, 700B onto the leading edge detector 74B. FIG. 7b shows the lead 40 beginning to occlude beam 3 and continuing to occlude beam 4. At this time, the photodetector 74B which receives light from beams 3 and 4 will receive no laser beam light.

FIGS. 7c and 7d depict operation of the trailing edge detection system. The trailing edge laser light sources 60C, 60D project two laser beams 700C, 700D onto the trailing edge detector 74A. FIG. 7c shows the trailing edge 405 of the element 24 clearing beam 2 and allowing the beam to pass through to the photodetector 74A. In FIG. 7c, beam 1 is still occluded by the lead element 40. FIG. 7d shows the lead 40 unblocking beam 1 and allowing the beam 1 light to strike the photodetector 74A.

FIGS. 7a and 7b reveal the lower surface 414 of an element's leading edge 404 being detected by lasers 3 and 4. By detecting the shadow created by the leading edge 404 and occluding lasers 3 and 4, the sensor 50 can determine the height of the lead 40. To determine the height, the sensor system 50 uses the formula $$\text{height} = \frac{d \cos \phi \cos (\phi + \text{alpha})}{\sin \phi},$$

where d is the lateral distance travelled by the component 24 between the blocking of beam 3 and beam 4 and the angles beta 802 and alpha 804 are set at the factory when the sensor 50 is built. Again, the preferred angles alpha 804 and beta 802 are 15 degrees and 20 degrees respectively. Therefore, the relationship between height and lateral distance traveled is a constant based upon the angles chosen. Substituting the preferred angles into the equation above results in a constant equal to 2.97(h=2.97 d).

Figure 8:
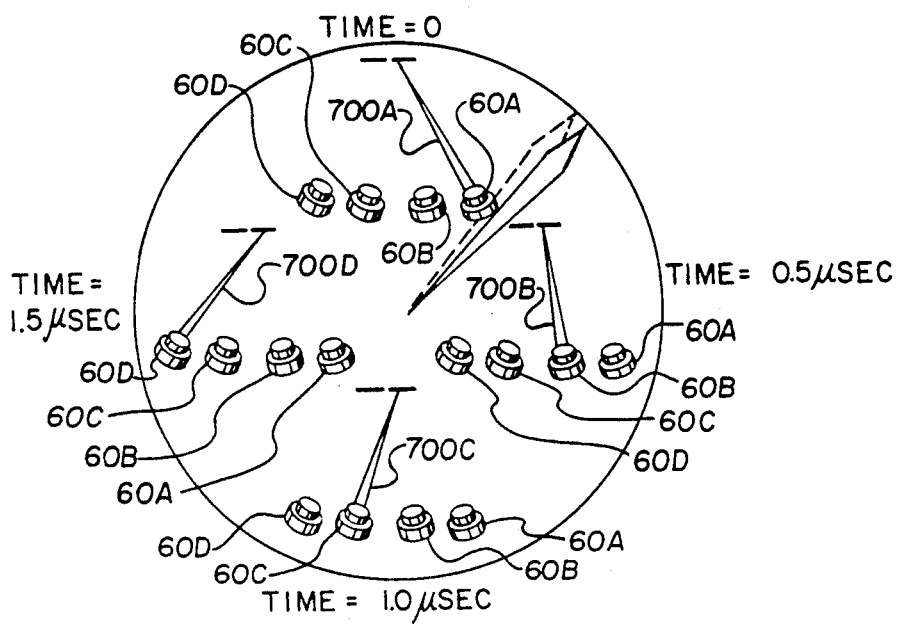
FIG. 8, diagrams the multiplexing of a four beam system.

FIG. 8 shows how four beams 700A-700D can be multiplexed. The multiplexing cycle shown is 2.0 microseconds. In this instance, each laser beam is activated for 0.5 microseconds. The beams 700A-700D are sequentially multiplexed in such a way that each beam is activated at the same time in which the previous beam is being deactivated. In the preferred embodiment, the beams 700A-700D are sequentially activated and deactivated so that the time interval between beams in the same pair is minimized. In other words, it is preferred that beams 3 and 4 follow in sequence and also that beams 1 and 2 follow in sequence. This minimizes the amount of time that the lead 40 may travel between state changes within a given pair of laser beams. By minimizing this time within a pair of beams, the system can treat the beams as if they were both constantly on. The total cycle time period for multiplexing the beams 700A-700D is two microseconds. This cycle period was found to be ideal and allows the microprocessor chips in the system to be moved at up to 500 meters per second without degrading the accuracy of the sensor. The two microsecond cycle poses no unusual problems for the electronic circuitry. The cycle is quick enough for the four beams to be considered constantly on for purposes of most calculations.

Figure 9:
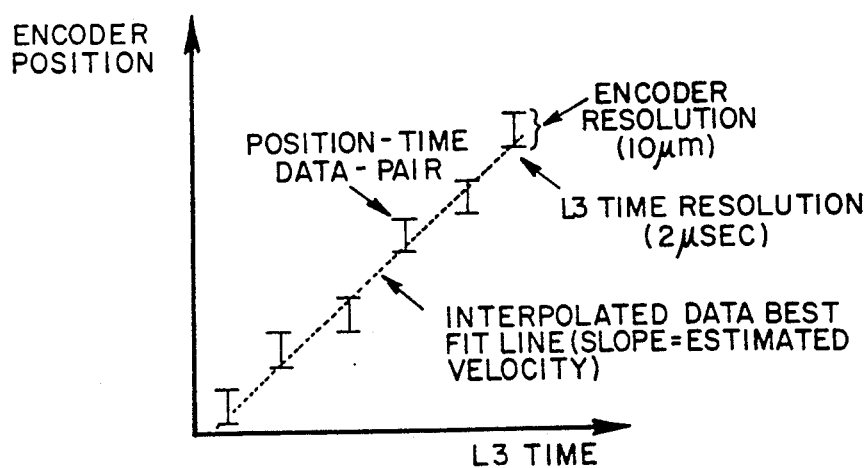
FIG. 9 graphs a best fit line interpolation of encoder position over time.

As already mentioned, the resolution of the measurements of lateral position along the scan axis directly affects the resolution of the calculated height. Although there are several methods for increasing the encoder 99 resolution, time interpolation is the preferred method. FIG. 9 displays a plot of the encoder 99 position versus time. In the preferred embodiment, the encoder position and time value are recorded each time there is a change of state in one of the laser beams. For example, for eight beam state changes, eight encoder values and eight time values will be recorded. In addition, if more data points are needed to perform the interpolation, the encoder position may be recorded from time to time solely to increase the number of data points. The accuracy of the time interpolation method will be negatively affected by variation in velocity. In particular, FIG. 9 shows an attempt at interpolating a best fit line on an axis of time versus encoder position. In the preferred embodiment, time interpolation is used to increase the encoder resolution from ten micrometers to one micrometer.

In the preferred embodiment, the sensor 50 assumes that the positioning head of the pick and place machine moves the chip past the sensor at a constant velocity. The encoder resolution is generally about ten micrometers. Since there is a ratio of approximately three to one between the lateral distance traveled and height calculations, a ten micrometer error in encoder position will yield an approximate error of thirty micrometers in the height determination. If the encoder resolution is satisfactory (one micrometer), then interpolation is not necessary.

In the preferred embodiment, the interpolation procedure has an error checking capability. The error checking compares the heights computed from the interpolated position with the heights computed from the raw encoder positions and if the discrepancy between the heights is above a preset threshold, the system will indicate that the velocity is not held constant. If the chip 24 is not found to be traveling at a constant speed, an LED light is lit to indicate a possible error in the interpolation.

Although in the preferred embodiment, the chip 24 is moved at a constant velocity, the invention will work equally as well at nonconstant velocities if the velocity profile of the chip is known. In order to obtain the optimum speed of the chip 24 through the sensor 50, the chip 24 would have to be accelerated until reaching the center of the sensor 50 and then decelerated. After deceleration, the chip 24 can be rotated to check leads 50 on another side of the chip 24.

A phased locked loop method may also be utilized for increasing encoder resolution. The phase locked loop (PLL) 114 can increase encoder resolution by acting as a pulse rate multiplier. The phase locked loop multiplier takes in a pulse train at a given rate, and outputs a pulse train at some multiple of the input rate. For example, the phase locked loop 114 receives encoder pulses from the encoder 99 and produces ten times the number of these pulses within the same time period, thereby increasing the resolution. However, the phase locked loop approach has certain limitations that make it less preferable in comparison with the time interpolation method. As is well known, phase locked loops 114 do not work as well over a wide range of frequencies with potentially inconsistent velocity profiles. Therefore, the time interpolation method has been found to be the most accurate, least expensive and least restrictive method to increase encoder resolution.

In addition to an LED error light for interpolation, the preferred embodiment has LED error lights for software errors and hardware errors.

Figure 10A:
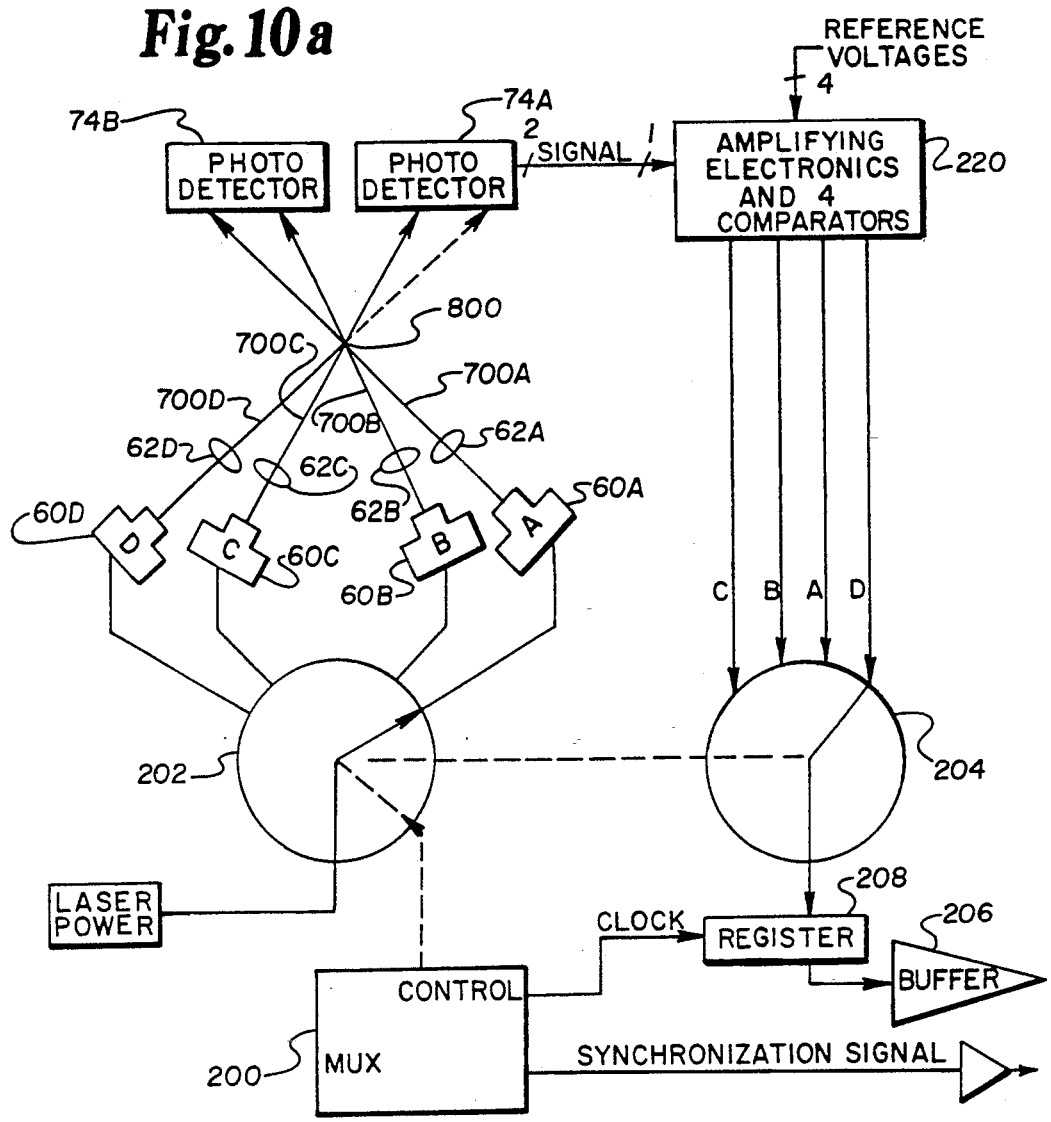
FIG. 10a is a schematic of the electronics for the lasers and photodetectors.
Figure 10B:
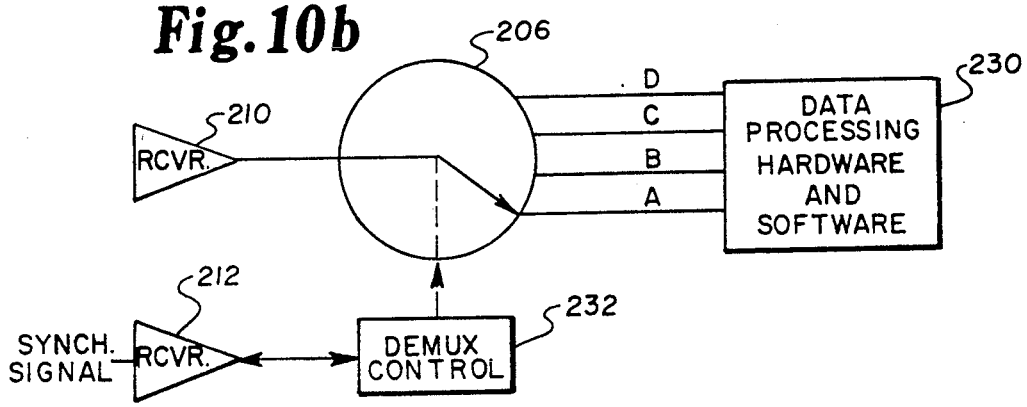
FIG. 10b diagrams the interface to the data processing hardware and software.

FIGS. 10a and 10b show the basic electronics of the preferred four laser beam embodiment. One multiplex controller 200 assists in multiplexing the laser beams 700A–700D, and generates a synchronization signal from the photodetectors 74A, 74B.

In the operation of the beam activation system, signal A is sampled into a register as laser power is switched from laser A to laser B. Similarly, laser B is sampled into the register when the multiplexer 202 switches from laser beam B to laser C. This sampling process continues sequentially through laser D and then returns to laser A. Since the signal is most stable after the particular laser has been on for a period of time, each laser is sampled at the moment before it is turned off or deactivated.

Although one electric signal is received from each photodetector 74A, 74B, the system maintains a separate threshold voltage or reference voltage for each laser beam. Four comparators 220 are preferred to correspond to each of the four reference voltages. Four reference voltages are provided to the comparators 220 and each reference voltage can be independently adjusted to compensate for dirty lenses and long term laser drift. Each comparator compares the detector output voltage to the particular reference voltage to provide a digital output measurement of the particular beam blockage. Since there are four laser beams 700A–700D, there will be four corresponding binary outputs.

In order to utilize a single cable to carry the beam data from the amplifying electronics to the data processing equipment 230, a switch 204 is utilized to multiplex the four binary output values. The multiplexed signal is then demultiplexed by another switch 206 using the synchronization signal under the control of the multiplex controller 200 prior to the processing of the data. A second cable carries the synchronization signal to the data processor 230.

The data processing hardware and software 230 performs the interpolation and height calculations. In addition, the data is processed to determine if there are any errors. The data processor 230 can determine lead width by taking the difference between the leading edge and trailing edge. With the lateral position and height of each corner, the thickness and twist of the lead 40 can be calculated. The data processing hardware and software 230 can compute the thickness of the lead by taking the difference in height between top edge, on either side, and the bottom edge, also on either side. The data processing hardware and software 230 can also compute the twist of the lead 40 based on the detected heights of the 4 edge corners.

Those skilled in the art will recognize that a number of alternative computations are possible with the system of the present invention. Available memory associated with the processor 230 allows for a downloadable component library specifying lead width and spacing for all components 24 to be sensed and analyzed by the sensor 50. It is possible to detect and analyze only the leading edge data and use the component library information to generate the centerline and proper placement of each lead 40. For more precise measurement, trailing edge data can be utilized as well for both lateral position and height analysis.

Although not illustrated in FIG. 6, or subsequent Figures, it also will be obvious to those skilled in the art that the beams of the multiple beam systems need not physically intersect. It is possible to displace the beams from each other with a known offset, to be sure that light from laser beam A has no chance of scattering into detector B. Another method of ensuring that there is no interference between the beams is to use multiple wavelengths of light with appropriate optical bandpass filters interposed before the detectors allowing only light from one source to be detected. Other expedients such as baffles (not shown) are also possible between the beams.

Rather than single focus beams 70 of light, a stripe of laser light may be used. The stripe is created from the single laser light source 60 with a source lens and stripe projecting optical element. The source lens and stripe projecting optical element may be combined to form a single optical element.

Shown in FIG. 11 is a secondary laser sensor 50' of substantially similar design to that shown and discussed in connection with FIGS. 2 and 3, which can be advantageously used with the present invention 50 to more precisely locate the placement head 30 of the component placement machine and thus more precisely identify lead 40 locations with the highest degree of accuracy and resolution.

Some additional problems can occur as higher resolution is achieved in sensing and finer-pitch components 24 are built. Component placement machines from the encoder 99, the rail frame 32 upon which the placement head 30 is carried, the placement head 30 and vacuum quill 36 have a finite stiffness. That is, they are not infinitely stiff. The associated quill position encoder 99 monitors relatively accurately the position of the placement head 30 and vacuum quill 32 in a static sense so that the head 30 can be precisely located by reading the encoder 99. In the dynamic sense, more of a problem exists, particularly when the placement head 30 is being accelerated and during travel this becomes more important as the pitch becomes very, very fine. Since it is an object of the present sensor 50 to measure where the part 24 and the part leads 40 are relative to the quill 34, precise resolution on the order of 1 micron requires a precise location of the placement head 30 and associated quill 34.

Precise location of the placement head 30 can be achieved with the use of a similar sensor 50' as shown in FIG. 11a, which is configured to sense an optical target 150 secured to the bottom of the placement head 30. As illustrated in FIG. 11b and 11c, the optical target 150 preferably alternates transparent portions 152 and opaque portions 154 so that the processing mechanism 50' can detect the position of the placement head 30 with the sub-micron precision which characterizes the present invention. Shown in FIG. 11c is an alternative embodiment constructed so as not to interfere with movement of the placement head 30. For purposes of the configuration of the embodiment of FIG. 11c, the optical target 150 can be preferably constructed of chrome 154 on glass 152 so that the reflection of the laser beam 70' from the reflective chrome surface 154 can be detected by the detector 74' for highly accurate determination of the placement head 30 and the associated quill 34, component 24 and component leads 40.

Figure 12A:
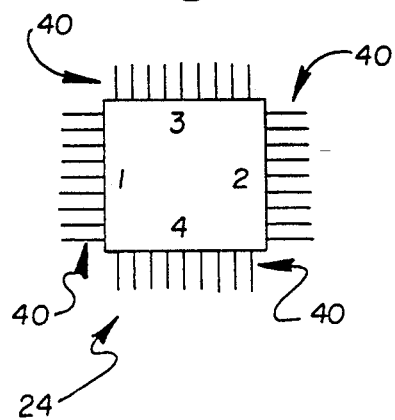
FIG. 12a is a representation of a four-sided semiconductor chip such as a quad pack integrated circuit.
Figure 12B:
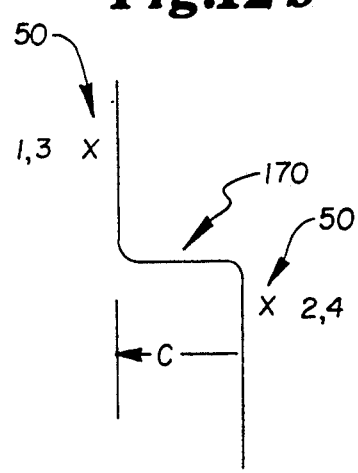
FIGS. 12b and 12c illustrate paths of the component placement head when using a plurality of sensors constructed in accordance with the present invention.
Figure 12C:
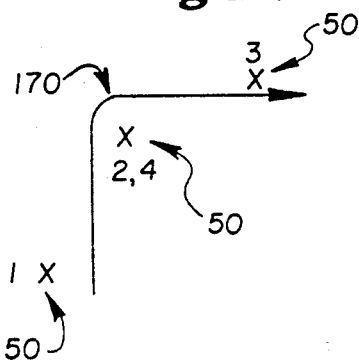

Using any of the various embodiments of the invention which have been described previously, highly accurate and precise location of the lateral displacement and height of the various leads 40 on an IC or other semiconductor device 24 can be determined. Referring to FIG. 12, in a component placement machine, a single sensor 50 can be used wherein all four sets 1-4 of leads 40 can be sequentially checked and determined. Since the component 24 must be stopped and passed through the sensor 50 four times, this, of course, is the most time consuming procedure. Similarly, two sensors 50 can be used where the component 24 is passed through the sensor 50 to check a first set of leads, side two as shown in FIG. 12b, and the component 24 jogged along the path 170 shown in FIG. 12b through the use of the placement head 30 a specified distance (c) depending on the component library to read the opposing set of leads 40, side one as shown in FIG. 12a. The component 24 can then be rotated 90 degrees and passed back through the two sensor system 50 to check the leads 40 on sides three and four as shown in FIG. 12a. Similarly, a three sensor system 50 can be used as shown in FIG. 12c, wherein a first sensor 50 checks the set of leads 40 on side one and a second sensor 50 checks the leads 40 on side two, following which the placement head 30 performs a 90-degree change in direction permitting the second sensor 50 to check the leads 40 on side four and third sensor 50 to check the leads 40 on side three. It is obvious that four independent sensors can also be utilized. For carousel or turret placement systems, it would be possible to have one or more sensing systems 50 housed at one or more stations. For high speed cartesian placement systems, it is possible to house one or more laser sensors in the same housing or enclosure with a 4 to 6 inch separation to accommodate maximum part 24 sizes.

A basic laser sensor which can detect bent leads 40 on an integrated circuit chip 24 with a resolution of less than 1 micron has been disclosed in conjunction with FIG. 2. Various alternative embodiments using the basic laser sensor 50 as a building block have been shown and discussed, which, when combined, can provide precise horizontal and vertical placement of the lowest surface of the leads 40 of a semiconductor device to a horizontal and vertical resolution on the order of less than one micron thereby allowing the part to be placed substantially within the accuracy and resolution of the component placement machine. Alternative embodiments capable of calculating colinearity, coplanarity, lead twist, and lead width have been described. While a number of alternative embodiments have been disclosed, it will be obvious to those skilled in the art that other modifications and variations are possible. Within the teaching of the present invention, each of such modifications and variations are within the intention of the invention as described by the following claims.

Having described our invention, we claim:

1. A multi-beam sensor for determining the height of each element of a multiple element device of the type having each of its elements nominally disposed in a single horizontal plane, wherein the multiple element device is in motion relative to the multi-beam sensor, the multi-beam sensor comprising:

at least one means for providing light;

first means for focusing light from the light providing means into a first beam of light having a focal point at the intersection of the horizontal plane and a vertical reference plane and forming an angle beta of between 5 and 25 degrees with the vertical reference plane;

second means for focusing light from the light providing means into a second beam of light having a focal point at the intersection of the horizontal plane and the vertical reference plane and forming an angle with the vertical reference plane that is greater than the angle beta;

detecting means, located in the path of each of the beams, for detecting the shadow created by occlusion of the first beam by an element edge of the multiple element device and the shadow created by occlusion of the second beam by the element edge;

means for receiving data indicating the instantaneous lateral position of the multiple element device as each shadow created by the element edge of the multiple element device is detected by the detecting means; and logic means, connected to the detecting means and to the means for receiving data, for calculating the height of the element edge from the horizontal plane whereby the calculation of the height is based on the instantaneous lateral position of the multiple element device as each shadow is created by the element edge, comprising a means for interpolating the received data to obtain the instantaneous lateral position of the multiple element device.

2. The multi-beam sensor of claim 1 wherein the means for providing light comprises two laser diodes.

3. The multi-beam sensor of claim 1 wherein the means for detecting the shadows comprises two photodetectors.

4. The multi-beam sensor of claim 1 wherein the logic means calculates the element edge height from the horizontal reference plane by determining lateral distance traveled by the element edge between the first beam and the second beam and multiplying by a constant.

5. The multi-beam sensor of claim 1 wherein the interpolating means comprises a phase-locked loop.

6. The multi-beam sensor of claim 1 wherein the interpolating means comprises a timing device for performing time interpolation.

7. The multi-beam sensor of claim 1 wherein a best fit line is defined as the minimization of the sum of the squares deviations of the heights of the leads and the logic means calculates the deviation of the element edge height from the best fit line.

8. The multi-beam sensor of claim 1 wherein a seating plane is defined as the plane established by the contact points of three or more leads that support the multiple element device when it is placed on top of a planar surface and the logic means calculates the height of the element edge above the seating plane.

9. The multi-beam sensor of claim 1 wherein means for providing light further comprises a means for switching the beams so that they are alternately turned on and off.

10. A multi-beam sensor for determining the height of each element of a multiple element device of the type having each of its elements nominally disposed in a single horizontal plane, wherein the multiple element device is in relative motion so that each element has a leading edge and a trailing edge, the multi-beam sensor comprising:
   a leading edge detection system comprising:
      at least one leading edge light source;
      a means for focusing a pair of leading edge beams of light from the leading edge light source to intersect in the horizontal plane of the elements wherein the pair of leading edge beams is occluded by the leading edge of the element; and
      at least one leading edge detecting means for detecting leading edge shadows created by the occlusion of the pair of leading edge beams by the leading edge of the element; a trailing edge detection system comprising:
   at least one trailing edge light source;
   a means for focusing a pair of trailing edge beams of light from the trailing edge light source to intersect in the horizontal plane of the elements wherein the pair of trailing edge beams is occluded by the trailing edge of the element; and
   at least one trailing edge detecting means for detecting trailing edge shadows created by the occlusion of the pair of trailing edge beams by the trailing edge of the element; and
logic means, connected to the leading edge detection system and connected to the trailing edge detection system, for determining the center height of the element above the horizontal plane, wherein the center height is the average of the leading edge height and the trailing edge height, the logic means comprising:
   means for calculating the height of the leading edge of the element based on data received from the leading edge detection means; and
   means for calculating the height of the trailing edge of the element based on data received from the trailing edge detection system.

11. The multi-beam sensor of claim 10 wherein colinearity is a measure of how well the heights of the leads on one side of an integrated circuit fit a best fit line defined as a line wherein the sum of the squares deviations of the leads are minimized and the logic means further comprises a means for determining colinearity of the elements based on the heights of the leading edge and trailing edge.

12. The multi-beam sensor of claim 10 wherein a seating plane is a plane formed by the contact points of three of more leads on a planar surface and the logic means further comprises a means for determining the seating plane of the elements on a multiple element device.

13. The multi-beam sensor of claim 10 wherein both light sources comprise laser diodes and a means for controlling the activation and deactivation of the leading edge and trailing edge beams.

14. The multi-beam sensor of claim 10 wherein the relative motion velocity of the multiple element device is constant and wherein the logic means further comprises a means for determining the relative distance traveled by the multiple element device between the beams of light by multiplying elapsed time traveled by the velocity.

15. The multi-beam sensor of claim 10 wherein instantaneous lateral position is the position of the multiple element device at the time of detection and further comprising a means for receiving the instantaneous lateral position of the multiple element device.

16. The multi-beam sensor of claim 15 wherein the receiving means receives lateral position information from an encoder and the receiving means further comprises a means for interpolating the lateral position of the multiple element device to increase the resolution of the encoder.

17. The multi-beam sensor of claim 16 wherein the interpolating means performs a straight line interpolation.

18. The multi-beam sensor of claim 15 wherein the receiving means further comprises a phase-locked loop to increase the resolution of the encoder.

19. A four beam sensor for determining the height of each element of a multiple element device of the type having each of its elements nominally disposed in a single horizontal plane, wherein the multiple element device is in motion relative to the four beam sensor, the four beam sensor comprising:
   first, second, third, and fourth light providing means;
   first focusing means for focusing light from the first light providing means into a first beam of light wherein a focal point of the first beam is at the intersection of the horizontal plane and a vertical reference plane and the first beam forms an angle beta of between 5 and 25 degrees with the vertical reference plane;

second focusing means for focusing light from the second light providing means into a second beam of light wherein a focal point of the second beam is at the intersection of the horizontal plane and the vertical reference plane and the second light beam forms an angle with the vertical reference plane that is greater than the angle beta;

third focusing means for focusing light from the third light providing means into a third beam of light wherein a focal point of the third beam is at the intersection of the horizontal plane and the vertical reference plane and the third beam forms an angle of negative beta with the vertical reference plane so that the third beam forms an angle of 2 beta with the first beam;

fourth focusing means for focusing light from the fourth light providing means into a fourth beam wherein a focal point of the fourth beam is at the intersection of the horizontal plane and the vertical plane and the fourth beam forms an angle that is greater than two beta with the first beam;

first detecting means, located in the path of the first and second beams, for detecting the shadow edges created by occlusion of the first beam by an element edge of the multiple element device and the shadow created by occlusion of the second beam by the element edge;

second detecting means, located in the path of the third and fourth beams, for detecting the shadow created by unblocking of the third beam by an element edge of the multiple element device and the shadow created by unblocking of the fourth beam by the element edge;

means for receiving data indicating the instantaneous lateral position of the multiple element device as each shadow edge created by the element edges of the multiple element device is detected by the first and second detecting means; and logic means, connected to the first and second detecting means and to the means for receiving data, for calculating the height of the element edge from the horizontal plane whereby the calculation of the height is based on the instantaneous lateral position of the multiple element device as each shadow edge is created by the element edges.

20. The four beam sensor of claim 19 comprising a means for multiplexing the light beams.

21. The four beam sensor of claim 19 comprising an interpolating means for more accurately determining the lateral position of the multiple element device.

22. The four beam sensor of claim 19 wherein the multiple element device is in motion and the four beam sensor is stationary.

23. The four beam sensor of claim 19 wherein the multiple element device's movement profile is known prior to calculations.

24. The four beam sensor of claim 19 wherein the first and second detecting means only detect the bottom edges of the leads.

25. The four beam sensor of claim 19 wherein a seating plane is a plane formed by the contact points of three of more leads on a planar surface and further comprising a means for determining the seating plane of the elements.

26. The four beam sensor of claim 19 wherein the twist of the lead is a measure of the angular disposition of a lead and the logic means further comprises means for calculating the twist of the lead.

27. The four beam sensor of claim 19 wherein the width of a lead is defined as the distance from one edge of the lead to the other edge and the logic means further comprises a means for calculating the width of the lead.

28. The four beam sensor of claim 19 wherein the thickness of a lead is the distance from the top edge of the lead to the bottom edge of the lead and the logic means further comprises a means for calculating the thickness of the lead.

29. The four beam sensor of claim 19 wherein colinearity is a measure of how well the heights of the leads on one side of an integrated circuit fit a best fit line defined as a line wherein the sum of the squares deviations of the leads are minimized and the logic means further comprises a means for determining the colinearity of a set of leads.

30. The four beam sensor of claim 19 wherein coplanarity is a measure of how well the heights of the leads of an integrated circuit fit a plane defined by the nominal position of the leads and the logic means further comprises a means for determining the coplanarity of a set of leads.

31. The four beam sensor of claim 19 wherein the first and second detecting means only detect the top edges of the leads.

32. A method for determining the height, from a horizontal reference plane, of the lower surface of a lead on a multiple lead device and for determining whether the lead height is within an acceptable height deviation, the method comprising:

defining a vertical reference plane;

defining a horizontal reference plane;

generating a first laser beam;

focusing the first laser beam at the intersection of the horizontal and the vertical reference plane so that it forms an angle beta with the vertical reference plane which is between 5 degrees and 30 degrees;

generating a second laser beam;

focusing the second laser beam at the intersection of the horizontal and the vertical reference plane so that it forms an angle of beta plus alpha with the vertical reference plane where the angle alpha is between 7 degrees and 23 degrees;

moving the multiple lead device in a horizontal direction so that each lead's lower surface passes through each of the two laser beams;

detecting a first state change caused by occlusion of one of the two laser beam's by a lead edge;

detecting a second state change caused by occlusion of the laser beam not involved in the first state change and caused by the lead edge;

measuring the lateral distance the lead travels from the position in which the lead causes the first state change to the position in which the lead causes the second state change;

calculating the height of the lead edge above or below the horizontal reference plane by multiplying the lateral distance traveled by cosine (beta) and cosine (beta+alpha), and dividing the total by sin (beta);

determining an allowable height deviation;

comparing the calculated lead edge height with the allowable height deviation; and creating an electrical rejection signal if lead edge height is greater than the allowable height deviation.

33. The method of claim 32 further comprising the step of calculating a center lead height by averaging the height calculated for a leading edge of the lead and the height calculated for a trailing edge of the lead.

34. The method of claim 32 wherein the step of measuring the lateral distance traveled includes time interpolation.

35. The method of claim 32 further comprising the step of multiplexing of the two laser beams.

36. The method of claim 32 wherein colinearity is a measure of how well the heights of the leads on one side of an integrated circuit fit a best fit line and further comprising the step of calculating colinearity of a set of leads.

37. The method of claim 32 wherein a seating plane is a plane formed by the contact points of three of more leads on a planar surface and further comprising the step of locating the seating plane.

38. The method of claim 32 further comprising the step of receiving the instantaneous lateral position of the multiple lead device.

39. The method of claim 32 further comprising detecting a third state change and a fourth state change caused by a trailing edge unblocking the laser beams.

40. A method for determining the height of each element of a multiple element device of the type having each of its elements nominally disposed in a single horizontal plane, wherein the multiple element device is in relative motion and each element has a leading edge and a trailing edge, the method comprising:
    detecting the leading edge, comprising:
        generating a leading edge light;
        focusing a pair of leading edge beams of light from the leading edge light, in the horizontal plane of the elements wherein the pair of leading edge beams is occluded by the leading edge of the element; and
        ascertaining leading edge shadows created by the occlusion of the pair of leading edge beams by the leading edge of the element; detecting the trailing edge, comprising:
    generating a trailing edge light;
    focusing a pair of trailing edge beams of light from the trailing edge light, in the horizontal plane of the elements wherein the pair of trailing edge beams is occluded by the trailing edge of the element; and
        ascertaining trailing edge shadows created by the occlusion of the pair of trailing edge beams by the trailing edge of the element; and
    determining the center height of the element above the horizontal plane, with data received from detecting the leading edge and data received from detecting the trailing edge, wherein the center height is the average of the leading edge height and the trailing edge height, comprising:
        calculating the height of the leading edge of the element based on data received from detecting the leading edge; and
        calculating the height of the trailing edge of the element based on data received from detecting the trailing edge.

41. The method of claim 40 wherein colinearity is a measure of how well the heights of the leads on one side of an integrated circuit fit a best fit line and further comprising calculating the colinearity of the elements based on the center height of the elements.

42. The method of claim 40 wherein a seating plane is a plane formed by the contact points of three of more leads on a planar surface and further comprising calculating the seating plane of the elements.

43. The method of claim 40 further comprising multiplexing of the four beams.

44. The method of claim 40, wherein the multiple element device's relative motion is at a known velocity and wherein the step of ascertaining trailing edge shadows further comprises determining time traveled between the beams of light, further comprising measuring the distance traveled by the multiple element device.

45. The method of claim 40 further comprising receiving the instantaneous lateral position of the multiple element device, between the beams of light by multiplying the time traveled by the known velocity of the multiple element device.

46. The method of claim 45 wherein the instantaneous lateral position is received from an encoder, the method further comprising interpolating the position of the multiple element device to increase the resolution of the encoder.

47. The method of claim 46 wherein the interpolation is a straight line interpolation.

48. The method of claim 45 further comprising the step of creating of additional lateral position data with a phase locked loop.

49. The method of claim 40 wherein the height of the leading edge is determined by the formula $$\text{height leading edge} = \frac{D \cos(\text{beta}) \cos(\text{beta} + \text{alpha})}{\sin(\text{beta})}$$

where D equals the lateral distance traveled between the leading edge beams, the angle beta equals the angle between of the leading edge beams and the vertical reference plane, and the angle alpha equals the angle between the leading edge beams.

50. The method of claim 40 further comprising the step of determining occlusion of beams of light caused by bumpers located on the multiple element device.

* * * * *